（12）United States Patent
Lee

(10) Patent No.: US 8,704,683 B2
(45) Date of Patent: Apr. 22, 2014

(54) INPUT UNIT OF PORTABLE TERMINAL, PORTABLE TERMINAL USING THE SAME, AND OPERATION METHOD THEREOF

(75) Inventor: Min Hyoung Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 840 days.

(21) Appl. No.: 12/925,954

(22) Filed: Nov. 3, 2010

(65) Prior Publication Data

US 2011/0102022 A1    May 5, 2011

(30) Foreign Application Priority Data

Nov. 3, 2009    (KR) ......................... 10-2009-0105521

(51) Int. Cl.
*H03M 11/00*    (2006.01)
(52) U.S. Cl.
USPC .................. 341/22; 341/20; 341/26; 345/168

(58) Field of Classification Search
USPC .................... 341/20–22, 26; 345/168, 173
See application file for complete search history.

(56) References Cited

U.S. PATENT DOCUMENTS

| 6,222,466 | B1 * | 4/2001 | Uggmark ........................ 341/22 |
| 6,737,990 | B1 * | 5/2004 | Chau .............................. 341/22 |
| 7,688,230 | B2 * | 3/2010 | DiFatta et al. .................. 341/22 |
| 7,777,650 | B2 * | 8/2010 | Liao ............................... 341/22 |

\* cited by examiner

*Primary Examiner* — Albert Wong

(57) ABSTRACT

A portable terminal includes: a key row including a reference resistor, switches separately connected to the reference resistor, and a plurality of resistors connected to the switches, respectively; a reference voltage unit connected to the reference resistor and providing a reference voltage; and a first comparator and a second comparator dividing the reference voltage from the reference voltage unit by the reference resistor and at least one resistor connected to an activated switch, and receiving an analog key input signal corresponding to the divided reference voltage.

19 Claims, 4 Drawing Sheets

INPUT UNIT OF PORTABLE TERMINAL, PORTABLE TERMINAL USING THE SAME, AND OPERATION METHOD THEREOF

CROSS-REFERENCE TO RELATED APPLICATION(S) AND CLAIM OF PRIORITY

The present application is related to and claims the benefit of priority under 35 U.S.C. §119(a) to a Korean patent application filed in the Korean Intellectual Property Office on Nov. 3, 2009, and assigned Serial No. 10-2009-0105521, the entire disclosure of which is hereby incorporated by reference.

TECHNICAL FIELD OF THE INVENTION

The present invention relates to a portable terminal, and more particularly, to an input unit of a portable terminal discriminating an input signal using an analog digital converter (ADC) and a comparator, and a portable terminal using the same, and an operation thereof.

BACKGROUND OF THE INVENTION

A portable terminal is a terminal supporting a call function based on mobility, which has been used in very wide fields due to convenient utility and easy portability. The portable terminal provides various input schemes for providing a user function.

In particular, a conventional portable terminal uses a key pad as an input unit. The key pad includes a matrix structure in which a plurality of keys are arranged to have a predetermined array. To discriminate a key input signal generated in the key pad, a controller includes a plurality of ports connected by columns and rows forming a matrix structure. For example, when the conventional portable terminal uses a 25-key structure, a matrix structure needs five columns and five rows. Accordingly, in the conventional portable terminal, ten ports in the controller are allotted for the key pad. However, since the number of ports of the controller is restrictive, when a number of ports are allotted to the key pad, there is a need for an additional configuration for extension of ports. Furthermore, in recent years, various modules have been added to the portable terminal to support various user functions. Because additional modules require allotment of specific ports of a controller, as time goes by, ports of the controller is significantly lack.

SUMMARY OF THE INVENTION

To address the above-discussed deficiencies of the prior art, it is a primary object to provide a portable terminal that can discriminate an input signal while reducing the number of ports, and a portable terminal using the same and an operation thereof. The present invention has been made in view of the above problems, and provides a portable terminal that may discriminate an input signal while reducing the number of ports, and a portable terminal using the same and an operation thereof.

In accordance with an aspect of the present invention, an input unit of a portable terminal includes: a key row including a reference resistor, a number of switches separately connected to the reference resistor, and a plurality of resistors connected to the switches, respectively; a reference voltage unit connected to the reference resistor and configured to provide a reference voltage; and a first comparator and a second comparator that can divide the reference voltage from the reference voltage unit by the reference resistor and at least one resistor connected to an activated switch, and can receive an analog key input signal corresponding to the divided reference voltage.

In accordance with another aspect of the present invention, a portable terminal includes: a key row including a reference resistor, a number of switches separately connected to the reference resistor, and a plurality of resistors connected to the switches, respectively; a reference voltage unit connected to the reference resistor and that can provide a reference voltage; and a first comparator and a second comparator that can divide the reference voltage from the reference voltage unit by the reference resistor and at least one resistor connected to an activated switch, and can receive an analog key input signal corresponding to the divided reference voltage.

In accordance with another aspect of the present invention, an operation method of an input unit of a portable terminal includes: activating at least one switch of a plurality of switches in a key row including a reference resistor, each of the switches separately connected to the reference resistor, and a plurality of resistors connected to the switches in parallel and including different resistance values, respectively; generating an analog key input signal by dividing a reference voltage by the reference resistor and a certain resistor connected to the activated switch; comparing the analog key input signal with a first comparator voltage and a second comparator voltage, respectively; and checking whether the generated analog key input signal is valid according to the comparison results.

In a portable terminal, a portable terminal using the same and an operation thereof according to an embodiment of the present invention, the present invention may discriminate input signals allotted to respective keys while reducing the number of ports allotted to a key pad.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device.

Figure 1:
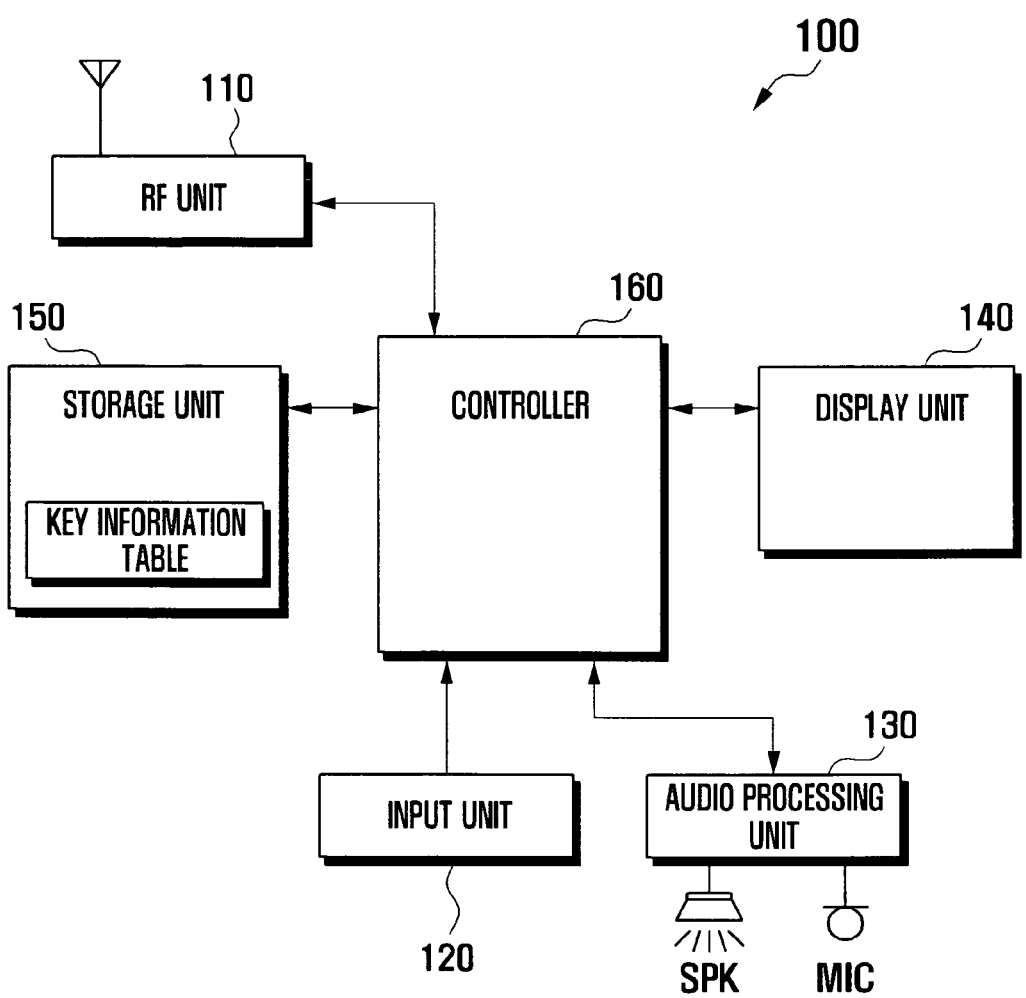
FIG. 1 illustrates a configuration of a portable terminal according to an exemplary embodiment of the present invention.

FIG. 1 illustrates a configuration of a portable terminal according to an exemplary embodiment of the present invention.

Referring to FIG. 1, the portable terminal 100 includes a radio frequency (RF) unit 110, an input unit 120, an audio processing unit 130, a display unit 140, a storage unit 150, and a controller 160.

In the portable terminal 100 includes a structure as described above, the input unit 120 is composed of a plurality of resistors and a plurality of switches. Respective switches connect to one signal line in parallel. Accordingly, the input unit of the portable terminal 100 may generate an analog key input signal corresponding to variation of a reference voltage based on a resistance value of a resistor connected to an activated switch. The portable terminal 100 can discriminate the generated analog key input signal based on a key information table stored in the storage unit 150 to support operations of a plurality of key input signals using a small number of ports. Hereinafter, respective structural elements of the portable terminal 100 and functions thereof will be described in detail. Here, the RF unit 110 is a configuration capable of being added when the portable terminal 100 includes a communication function. The audio processing unit 130 is a configuration that can be added when the portable terminal 100 includes an audio data output function, which can be omitted from the configuration of the portable terminal 100 according to a designer's intention.

The RF unit 110 can form a communication channel for voice call, a communication channel for video call, and a communication channel for data transmission, such as images or messages, under the control of the controller 160. To do this, the RF unit 110 can include an RF transmitter that up-converts a frequency of a transmitted signal and amplifies the signal, and an RF receiver that can low-noise-amplify a received signal and down-convert the signal. The RF unit 110 can be selected and activated according to a key input signal generated from the input unit 120. Further, in a case where the portable terminal 100 supports a speed dial function, the RF unit 110 can form a communication channel based on a telephone number linked to a corresponding key input signal when a specific key input signal is generated from the input unit 120.

An input unit 120 receives numerals or character information, and includes a plurality of input keys and function keys to set all types of functions. The function keys can include arrow keys, side keys, and hot keys set to perform specific functions. Meanwhile, the input unit 120 generates key signals associated with a user set and function control of the portable terminal 100 and transfers them to the controller 160.

The input unit 120 can be implemented by a Qwerty key pad, a 3×4 key pad, or a 4×3 key pad. In this case, the input unit 120 may include a key row passing through respective keys provided at respective key pads, and a comparator comparing an analog key input signal generated from the key row with a preset reference value to check whether the analog key input signal is valid. A circuit arrangement of the input unit 120 will be explained in detail with reference to FIG. 2 and FIG. 3.

The audio processing unit 130 includes a speaker SPK that can play audio data transmitted and received at the time of a call, audio data included in received data, and audio data associated with an audio file stored in the storage unit 150, and a microphone MIC that can collect a user's voice or other audio signals at the time of a call. When a disposed area of a specific key in the input unit 120 is pressed by external pressure, the audio processing unit 130 can output an audio signal corresponding to the specific key through the speaker SPK. Accordingly, a user can listen to a sound corresponding to the pressed key based on the audio signal output through the speaker SPK.

The display unit 140 displays input information of the user or information provided to the user as well as all types of menus of the portable terminal 100. Namely, the display unit 140 can provide various screens, for example, an idle screen, a menu screen, a message write screen, and a call screen according to a user of the portable terminal 100. The display unit 140 can be configured by a Liquid Crystal Display (LCD) or an Organic Light Emitted Diode (OLED). In particular, a display unit 140 of the present invention can output a numeral or a character allotted to a pressed key in the input unit 120 of the portable terminal 100. Further, in a state that a user function of the portable terminal 100 is linked, when a specific key is activated, the display unit 140 can output a screen corresponding to activation of the user function.

The storage unit 150 can store a key information table for operation of the input unit 120 as well as an application program necessary for a function operation according to an embodiment of the present invention. The storage unit 150 can include a program area and a data area.

The program area stores an operating system (OS) for operations of booting and the foregoing configurations of the portable terminal 100 and application programs playing various files. There is an application program for supporting a call function according to presence of function support of the portable terminal 100, a web browser accessing an Internet server, an MP3 application program for playing other sound sources, an image output application program playing photographs and a moving image play application program as examples of the application programs. In particular, a program area of the present invention includes an input signal processing program processing an input signal generated by the input unit 120.

The input signal processing program is a program that checks a type of an input signal based on a signal transferred to a predetermined port of the controller 106 and controls activation of various user functions based on a corresponding input signal. When power is supplied to the portable terminal 100, the input signal processing program is loaded according to the control of the controller 160 to process signals generated by the input unit 120 prior to termination of the portable terminal 100. To do this, the input signal processing program can include a routine loading a key information table stored in the storage unit 150, a routine checking validity of a currently input analog key input signal according to a signal transferred from a comparator, a routine comparing an analog key input signal from a key row with a key information table to check a type of the analog key input signal, and a routine controlling activation of a specific user function according to the checked analog key input signal.

The data area is an area storing data created according to a use of the portable terminal 100, and may store at least one icon and various contents according to a widget function. In particular, the data area can store a key information table. The key input table is a table that stores which key values correspond to various analog key input signals generated by the input unit 120. When power is supplied to the portable terminal 100, the key information table can be loaded on the controller 160. Alternatively, when supply of the power stops, the key information table loaded on the controller 160 can be removed.

The controller 160 controls power supply to respective structural element of the portable terminal 100 to support execution of an initialization procedure. In this procedure, the controller 160 loads a key information table stored in the data area of the storage unit 150 and controls discrimination of a key value of an analog key input signal generated by the input unit 120. In this case, the controller 160 can check validity of an analog key input signal generated by the input unit 120 according to a signal transferred to a port connected to a comparator of the input unit 120 among ports connected to the input unit 120. When a current analog key input signal generated by the input unit 120 is valid, the controller 160 checks a key value of the analog key input signal to perform a user function corresponding to the key value thereof. For example, when an analog key input signal corresponding to dialing a phone is generated after generation of analog key input signals corresponding to a telephone number, the controller 160 checks whether the generated analog key input signals are valid, respectively.

When the generated analog key input signals are valid, the controller 160 discriminates key values corresponding thereto with reference to the key information table. Furthermore, the controller 160 may activate the RF unit 110, and control formation of a communication channel with another portable terminal having a corresponding telephone number based on the discriminated key value. Determination of validity of the analog key input signals will be described in detail below. Meanwhile, when an analog key input signal for searching a music file and an analog key input signal for playing the searched file are generated, and the generated analog key input signals are valid, the controller 160 checks key vales corresponding to the generated analog key input signals based on the key information table. Moreover, the controller 160 can activate a music player to play a selected music file based on the corresponding key values. In addition, the controller can control the audio processing unit 130 to output an audio signal corresponding to playing the selected file, and control the display unit 140 to display a video signal according to playing the selected file.

As illustrated above, the controller 160 of the portable terminal 100 of the present invention checks whether an analog key input signal is valid using a comparator in which a plurality of keys provided at the input unit 120 are arranged in a key row. When the analog key input signal is valid, the controller 160 can control execution of a user function according to the analog key input signal. Accordingly, the controller 160 of the portable terminal 100 can support processing of an input signal by providing only a small number of ports connected to the key row and a port connected to the comparator. This will be described in detail with reference to FIG. 2 and FIG. 3.

Figure 2:
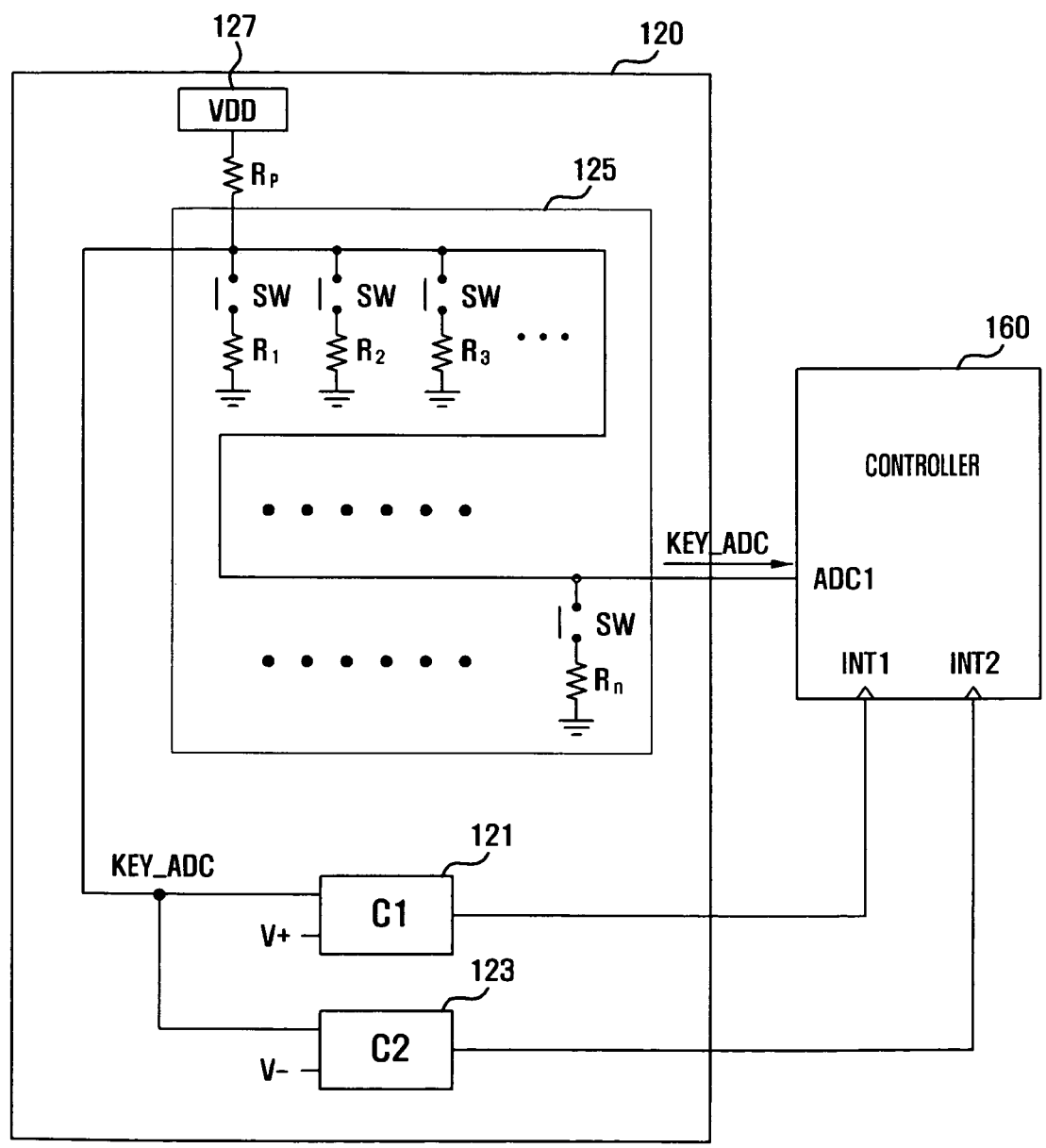
FIG. 2 illustrates a configuration of an input unit of a portable terminal according to a first embodiment of the present invention.

FIG. 2 illustrates configurations of the input unit 120 and the controller 160 of the portable terminal according to a first embodiment of the present invention.

Referring to FIG. 2, the input unit 120 can include a key row 125 in which a plurality of resistors $R_1$ to $R_n$ are connected to each other in parallel based on switches SW; a first comparator 121 and a second comparator 123 connecting with the key row 125; a reference voltage unit 127; and a reference resistor $R_P$ dividing a reference voltage VDD supplied from the reference voltage unit 127. The controller 160 can include an input signal port ADC1 connected to the key row 125, a first comparator port INT1 connected to the first comparator 121, and a second comparator port INT2 connected to the second comparator 123. In this case, the controller 160 can also include ports for signal transmission and reception with other configurations of the portable terminal 100, namely, the RF unit 110, the audio processing unit 130, and the display unit 140. However, FIG. 2 shows only a port connected to the input unit 120 for convenience for a description.

The key row 125 can include the same number of resistors $R_1$ to $R_n$ as the number of input keys included in the portable terminal 100, and switches SW disposed between the respective resistors $R_1$ to $R_n$ and a reference resistor $R_P$. Namely, the key row 125 can include the same number of a first resistor $R_1$ to, a second resistor $R_2$, a third resistor $R_3$, ..., an n-th resistor $R_n$ by the corresponding number of input keys; and switches SW disposed between the respective resistors and reference resistor $R_P$. For example, when the portable terminal 100 provides 25 keys arrangement, a total number of resistors included in the key row 125 is 25, and 25 switches can be provided. A plurality of resistors included in the key row 125 can be implemented to have different resistance values.

The reference voltage unit 127 provides a reference voltage VDD to the key row 125. Further, the reference resistor is associated with a resistor among the resistors disposed at the key row 125 connected to a switch SW being activated to divide the reference voltage VDD. When the user activates a certain switch SW included in the key row 125, a certain resistor connected to the certain switch SW connects with the reference resistor $R_P$ to divide the reference voltage VDD provided from the reference voltage unit 127. In this case, a voltage obtained by dividing the reference voltage VDD is referred to as 'analog key input signal KEY_ADC'. Since the analog key input signal KEY_ADC is a voltage achieved by dividing the reference voltage VDD by the reference resistor $R_P$ and a certain resistor connecting with a switch activated according to a user input, a value thereof can change according to the certain resistor. The analog key input signal KEY_ADC is transferred to a first comparator 121, a second comparator 123, and an input signal port ADC1 of the controller 160.

The first comparator 121 is disposed between the reference resistor $R_P$ and a first comparator port INT1 of the controller 160. The first comparator 121 receives an analog key input signal KEY_ADC generated by dividing the reference voltage VDD by the reference resistor $R_P$ and a certain resistor connected to a switch SW activated by a user operation. A first comparator voltage V+ used as a reference voltage is provided at the first comparator 121 to compare with the analog key input signal KEY_ADC. The first comparator 121 compares the analog key input signal KEY_ADC with the first comparator voltage V+, and transfers a comparison result signal to a first comparator port INT1 of the controller 160. For example, when the analog key input signal KEY_ADC is less than the first comparator voltage V+, the first comparator 121 may transfer a "High" signal being a first signal to the first comparator port INT1. When a separate analog key input signal KEY_ADC is not received, namely, when an input signal is greater than the first comparator voltage V+, the first comparator 121 may output a "Low" signal being a second signal. When a separate switch is not activated from the key row 125, the reference voltage VDD is transferred to the first comparator 121 through the reference resistor $R_P$. At this time, because the first comparator voltage V+ is less than the reference voltage VDD, when the user does not activate a certain switch from the key row 125, the first comparator 121 transfers a second signal, for example, a "Low" signal to the controller 160. Here, the first comparator voltage V+ is now described in detail. The first comparator voltage V+ can be set to be less than the reference voltage VDD and greater than the greatest voltage of the analog key input signal KEY_ADC.

$$\text{KEY\_ADC\_MAX\_} < V+ < VDD. \qquad [\text{Equation. 1}]$$

To do this, respective resistors included in the key row 125 can be manufactured to have an order of resistance values of first resistor $R_1$>second resistor $R_2$> . . . >n-th resistor $R_n$. Meanwhile, the resistors may be manufactured to have an order of resistance values of n-th resistor $R_n$> . . . >second resistor $R_2$>first resistor $R_1$ being a converse case.

In this case, the greatest analog key input signal KEY_ADC_MAX can be generated in the key row 125 by a voltage division between the reference resistor $R_P$ and the n-th resistor $R_n$. Hereinafter, it will be described that the first resistor $R_1$ among the resistors included in the key row 125 has the greatest resistance value. For example, assuming that the reference voltage VDD is 3V, a resistance value of the reference resistor $R_P$ is 10 kΩ, and a resistance value of the first resistor $R_1$ is 20 kΩ, the greatest analog key input signal KEY_ADC_MAX can be 2V by a voltage division between the reference resistor $R_P$ and the first resistor $R_1$. Accordingly, the first comparator voltage V+ can be set to a value greater than 2V and less than 3V, for example, 2.5V.

As described previously, the first comparator 121 can compare the analog key input signal KEY_ADC with the first comparator voltage V+ to generate a voltage necessary for determination of validity of the analog key input signal KEY_ADC. In the case, the analog key input signal KEY_ADC is generated by a voltage division between certain resistors connected with activated switches of the key row 125. Further, the first comparator 121 can transfer a first signal corresponding to the validity determination, for example, "High" signal to the controller 160.

The second comparator 122 is disposed between the reference resistor $R_P$ and a second comparator port INT2 of the controller 160. In the same manner as in the first comparator 121, the second comparator 123 receives an analog key input signal KEY_ADC generated by dividing the reference voltage VDD by the reference resistor $R_P$ and a certain resistor connected to a switch SW activated by a user operation. A second comparator voltage V− used as a reference voltage is provided at the second comparator 123 to compare with the analog key input signal KEY_ADC. The second comparator 123 compares the analog key input signal KEY_ADC with the second comparator voltage V−, and transfers a comparison result signal to a second comparator port INT2 of the controller 160. For example, when the analog key input signal KEY_ADC is less than the second comparator voltage V−, the second comparator 123 may transfer a "High" signal being a first signal to the second comparator port INT2. When a separate analog key input signal KEY_ADC is greater than the second comparator voltage V−, the second comparator 123 may output a "Low" signal being a second signal to the second comparator port INT2. The second comparator voltage V− can be set to a value obtained by dividing the reference voltage VDD by the reference resistor $R_P$ and parallel resistors included in the key row 125 having the greatest resistance value. The second comparator voltage V− can be set to a value obtained by dividing the reference voltage VDD by the reference resistor $R_P$ and a resistor of resistors included in the key row 125 having the greatest resistance value, for example a half of a resistance value of the first resistor $R_1$.

Here, the second comparator voltage V− is now described in detail. When switches SW connected to a resistor having the greatest resistance value and two resistors having a second greater resistance value among the resistors are activated, the second comparator voltage V− may be set to a value generated by voltage division between the reference resistor $R_P$ and two resistors connected to the activated switches SW.

For example, as mentioned above, assuming that respective resistors included in the key row 125 have an order of resistance values of first resistor $R_1$>second resistor $R_2$> . . . >n-th resistor $R_n$ switches SW connected to the first resistor $R_1$ and the second resistor $R_2$ are activated, a plurality of switches SW of the key row 125 can be activated to output the greatest voltage. Because respective resistors are connected in parallel although additional switches SW are activated, a total resistance value of resistors connected to the activated switches SW is reduced due to addition of parallel resistors. Accordingly, the second comparator voltage V− can be calculated by equation 2:

$$V- = [R_1/2]/[R_P + R/2] * VDD) \qquad [\text{Equation. 2}]$$

Here, since a divided voltage of the reference voltage VDD by the second resistor $R_2$ and the reference resistor $R_P$ is less than a dividing voltage of the reference voltage VDD by the first resistor $R_1$ and the reference resistor $R_P$ upon calculation of the second comparator voltage V−, the dividing voltage by the second resistor $R_2$ and the reference resistor $R_P$ is less than that by first resistor $R_1/2$ and the reference resistor $R_P$.

Accordingly, for convenience of calculation and in consideration of error ranges of resistance values, the equation 2 is expressed assuming that a resistor having a half of a resistance value of the first resistor $R_1$ is connected instead of a parallel resistance value between the first resistor $R_1$ and the second resistor $R_2$. In the meantime, when a resistance value of the n-th resistor $R_n$ is identical with a parallel resistance value between the first resistor $R_1$ and the second resistor $R_2$, although a key to which the first resistor $R_1$ and the second resistor $R_2$ are allotted is pressed, it may be wrongly recognized that the n-th resistor $R_n$ is pressed. Accordingly, it is preferred that the n-th resistor $R_n$ satisfies conditions of equation 3:

$$R_n > R_1/2 \qquad [\text{Equation. 3}]$$

When the second comparator voltage V− and a resistance value of the n-th resistor $R_n$ are determined, a plurality of keys in the key row 125 are pressed to connect a plurality of resistors to the reference resistor $R_P$ in parallel. Accordingly, an analog key input signal KEY_ADC obtained by dividing the reference voltage by respective resistors becomes less than the second comparator voltage V−. Accordingly, when a received analog key input signal KEY_ADC is less than the second comparator voltage V−, the second comparator 123 may generate and transfer a "High" signal to a second comparator port INT2 of the controller 160.

For example, assuming that the reference voltage VDD is 3V, a resistance value of the reference resistor $R_P$ is 10kΩ, a resistance value of the first resistor $R_1$ is 20 kΩ, a resistance value of the second resistor $R_2$ is 18kΩ, a parallel resistance value generated upon simultaneously pressing the first resistor $R_1$ and the second resistor $R_2$ may become 9.47 kΩ. A half of a resistance value of a first resistor ($R_1/2$) is applied for calculation of the second comparator voltage V−. Accordingly, the second comparator voltage V− may become 1.5V from equation 2. Here, a resistance value of the n-th resistor $R_n$ is set to be greater than a half of a resistance value of a first resistor ($R_1/2$). Meanwhile, a voltage dividing the reference voltage VDD by a parallel resistance value between the first resistor $R_1$ and the second resistor $R_2$, and the reference resistor $R_P$ can become 1.46 V. When the keys corresponding to the first resistor $R_1$ and the second resistor $R_2$ are simultaneously pressed, a value of an analog key input signal KEY_ADC is less than the second comparator voltage V−. Accordingly, the second comparator 123 can transfer a "High" signal to a second comparator port INT2 of the controller 160.

Meanwhile, in the foregoing description, the analog key input signal KEY_ADC is transferred to the first comparator 121 and the second comparator 123 simultaneously. Consequently, as listed in table 1, according to types of respective input signals transferred to the first comparator port INT1 and the second comparator port INT2, it can be checked whether the analog key input signal KEY_ADC transferred to an input signal port ADC1 is valid.

TABLE 1

| Cases | First comparator port | Second comparator port | Operations |
|---|---|---|---|
| Key is not pressed | Low | Low | — |
| Key is pressed | High | Low | Key operation based on analog key input signal value of pressed key |
| More than two keys are pressed | High | High | Not process analog key input signal |

Referring to table 1, when a "Low" signal is applied to a first comparator port INT1 and a second comparator port INT2 of the controller 160, the controller 160 checks that an operation from the input unit 120 is not performed. Accordingly, the controller 160 does not perform a separate operation by the input unit 120.

Meanwhile, when a "High" signal is transferred to the first comparator port INT1 and a "Low" signal is transferred to the second comparator port INT2, the controller 160 checks that a signal transferred to the input signal port ADC1 is valid. Accordingly, the controller 160 can check what key value has the analog key input signal KEY_ADC with reference to a key information table loaded from the storage unit 150. Further, the controller 160 can check a key value corresponding to the analog key input signal KEY_ADC and control activation of a user function corresponding thereto.

When a "High" signal is transferred to the first comparator port INT1 and the second comparator port INT2, the controller 160 checks that a signal transferred to the input signal port ADC1 is invalid. That is, when a "High" signal is transferred to the first comparator port INT1 and the second comparator port INT2, the controller 160 can check that more than two keys are simultaneously pressed and control not to execute checking a type of a signal currently transferred to an input signal port ADC1.

As illustrated previously, a portable terminal 100 according to an embodiment of the present invention provides a key row 125 in an input unit 120 composed of switches corresponding to respective keys and a plurality of resistors connected to the switches SW. Further, the portable terminal 100 can generate an analog key input signal KEY_ADC obtained by dividing the reference voltage VDD using a certain resistor connected to a reference resistor RP by activation of a certain switch SW. The portable terminal 100 transfers the analog key input signal KEY_ADC to the first comparator 121 and the second comparator 123 to determine whether it is applied as a valid value, and control activation of a user function based on the analog key input signal KEY_ADC transferred to an input signal port ADC1 according to the determination result. Accordingly, the portable terminal 100 of the present invention may use only three ports of the controller 160 to support 25 input keys. Here, the present invention has been described with 25 input keys by way of example. However, the present invention is not limited thereto. Namely, in the portable terminal of the present invention, a higher number of input keys, for example, 54 keys or 64 keys can be disposed in the key row 125 according to the number of resistors.

Figure 3:
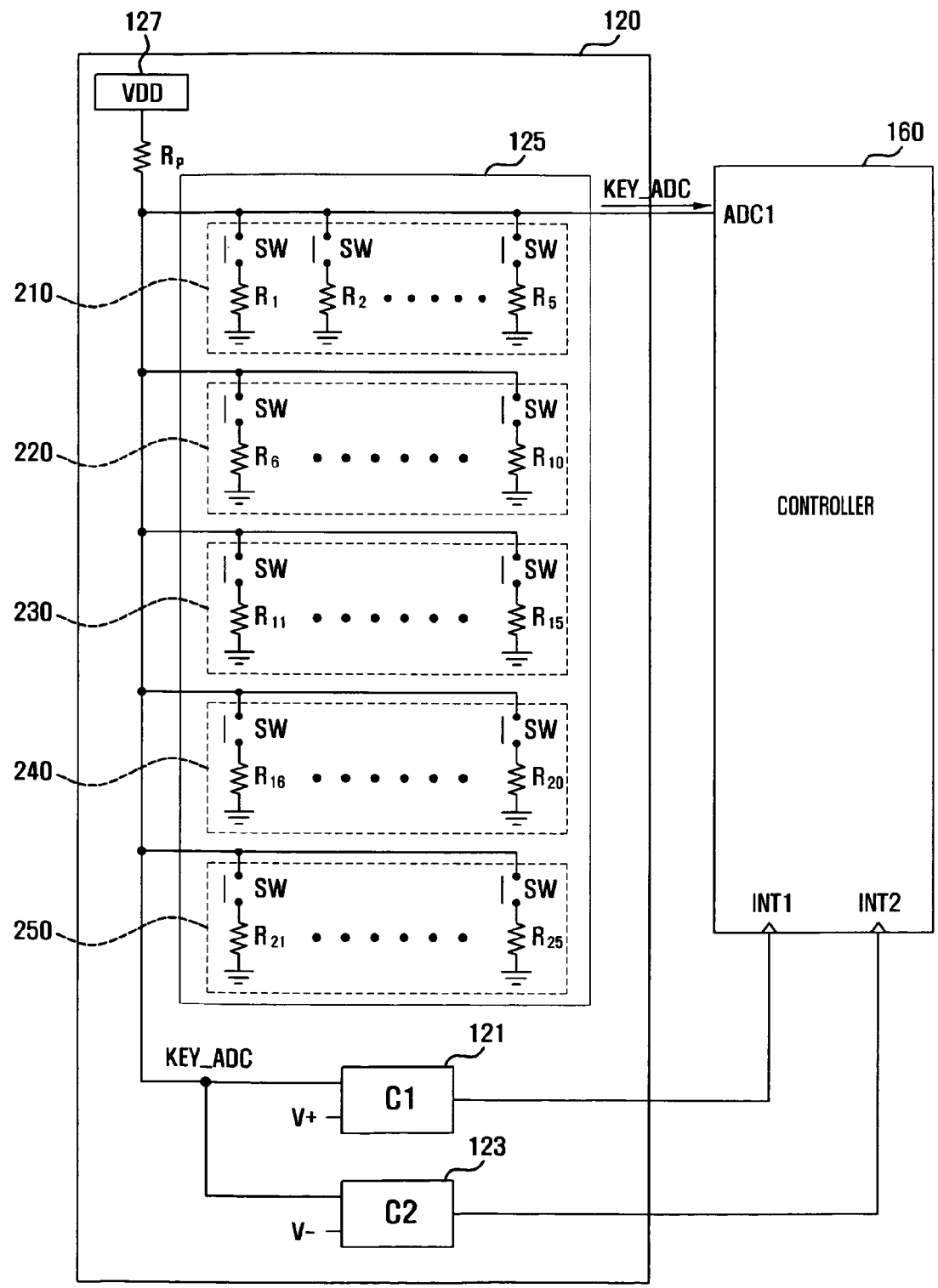
FIG. 3 illustrates a configuration of an input unit of a portable terminal according to a second embodiment of the present invention.

FIG. 3 illustrates configurations of the input unit 120 and the controller 160 of the portable terminal according to a second embodiment of the present invention.

Referring to FIG. 3, the input unit 120 according to a second embodiment of the present invention includes a key row 125 with a plurality of sub-key rows 210, 220, 230, 240, and 250; a reference voltage unit 127 supplying a reference voltage VDD to the sub-key rows 210, 220, 230, 240, and 250; a reference resistor $R_P$ disposed between the reference voltage unit 127 and sub-key rows 210, 220, 230, 240, and 250; and a first comparator 121 and a second comparator 123 connected at a contact point between the reference resistor $R_P$ and the sub-key rows 210, 220, 230, 240, and 250. The controller 160 may include an input signal port ADC1 connected to the sub-key rows 210, 220, 230, 240, and 250; a first comparator port INT1 connected to the first comparator 121; and a second comparator port INT2 connected to the second comparator 123. The controller 160 may further include ports for signal transmission and reception with various structural elements of the portable terminal 100 such as the RF unit 110, the audio processing unit 130, and the display unit 140. However, for convenience for a description, FIG. 3 shows only a port connected to the input unit 120.

The key row 125 may include the same number of resistors as the number of input keys included in the portable terminal 100, and switches SW disposed between the respective resistors and a reference resistor $R_P$. For convenience for a description, the key row 125 is now described that a total number of input keys are 25. The key row 125 may include a first sub-key row 210 having a first resistor $R_1$ to a fifth resistor $R_5$, a second sub-key row 220 having a sixth resistor $R_6$ to a tenth resistor $R_{10}$, a third sub-key row 230 having an eleventh resistor $R_{11}$ to a fifteenth resistor $R_{15}$, a fourth sub-key row 240 having a sixteenth resistor $R_{16}$ to a twentieth resistor $R_{20}$, and a fifth sub-key row 250 having a twenty first resistor $R_{21}$ to a twenty fifth resistor $R_{25}$. Respective sub-key rows 210, 220, 230, 240, and 250 connect with an input signal port ADC1 of the controller 160. The respective sub-key rows 210, 220, 230, 240, and 250 are also connected to a contact point between the reference resistor $R_P$ and the first comparator 121 and the second comparator 123. The key row 125 including the configuration mentioned above generates and transfers an analog key input signal KEY_ADC to the first comparator 121, the second comparator 123, and the input signal port ADC1. In this case, the analog key input signal KEY_ADC is generated by dividing a reference voltage VDD by the reference resistor $R_P$ and a certain resistor connected to an activated switch SW according to a user input.

The reference voltage unit 127 provides the reference voltage VDD to the key row 125. The reference resistor $R_P$ divides the reference voltage VDD in conjunction with a resistor connected to an activated switch SW among the resistors disposed at the sub-key rows 210, 220, 230, 240, and 250. The analog key input signal KEY_ADC generated by dividing a reference voltage VDD by the reference resistor $R_P$ and a certain resistor connected to an activated switch SW is transferred to the input signal port ADC1 of the controller 160. In the same manner as in the comparators of FIG. 2, the first comparator 121 is disposed between the reference resistor $R_P$ and a first comparator port INT1, and the second comparator 123 is disposed between the reference resistor $R_P$ and a second comparator port INT2. The first comparator 121 and the second comparator 123 receive an analog key input signal KEY_ADC generated by dividing the reference voltage VDD by the reference resistor $R_P$ and a certain resistor connected to an activated switch SW. The first comparator 121 compares the analog key input signal KEY_ADC with a first comparator voltage V+, and transfers a specific signal corresponding to the comparison result to the first comparator port INT1 of the controller 160. The second comparator 123 compares the analog key input signal KEY_ADC with a second comparator voltage V−, and transfers a specific signal corresponding to the comparison result to the second comparator port INT2 of the controller 160. The controller 160 can check whether the analog key input signal KEY_ADC transferred to an input signal port ADC1 is valid according to types of the respective signals transferred to the first comparator port INT1 and the second comparator port INT2.

For example, when a user applies pressure to a key corresponding to a switch SW connected to a first resistor $R_1$ of the first sub-key row 210 to electrically connect the first resistor $R_1$ to the reference resistor $R_P$, the reference voltage VDD from the reference voltage unit 127 may be divided by the reference resistor $R_P$ and the first resistor $R_1$ to generate an analog key input signal KEY_ADC. At this time, the analog key input signal KEY_ADC may be transferred to the first comparator 121, the second comparator 123, and the first input signal port ADC1.

As described earlier, the first comparator voltage V+ is set to be greater than a value obtained by dividing the reference voltage VDD by the reference resistor $R_P$ and the greatest resistance value of the key row 125, for example, the first resistor $R_1$. Furthermore, when the analog key input signal KEY_ADC corresponding to the voltage divided signal achieved by a certain resistor and the reference resistor $R_P$ is less than the first comparator voltage V+, the first comparator 121 may transfer a "High" signal to a first comparator port INT1 of the controller 160. Meanwhile, because the first comparator voltage V+ is less than the reference voltage VDD, when a specific key is not pressed, the first comparator 121 receives the reference voltage VDD and outputs a "Low" signal.

As described above, the second comparator voltage V− is set to a value greater than a voltage dividing a reference voltage VDD by the reference resistor $R_P$ and a half of a first resistor $R_1$, for example, having the greatest resistance value of the key row 125. When the analog key input signal KEY_ADC is less than the second comparator voltage V−, the second comparator 123 can transfer a "High" signal corresponding to a first signal to the second comparator port INT1 of the controller 160. Alternatively, when the analog key input signal KEY_ADC is greater than the second comparator voltage V−, the second comparator 123 may transfer a "Low" signal corresponding to a second signal to the second comparator port INT1 of the controller 160.

Accordingly, when a switch SW corresponding to one of plural keys included in the key row 125 are normally activated to generate an analog key input signal KEY_ADC, the first comparator 121 and the second comparator 123 output a "High" signal and a "Low" signal, respectively.

When the "High" signal is transferred to the first comparator port INT1 and the "Low" signal is transferred to the second comparator port INT2, the controller 160 checks that the analog key input signal KEY_ADC transferred to a first input signal port ADC1 is valid. Further, the controller 160 can check a key value corresponding to the analog key input signal KEY_ADC with reference to a key information table and control activation of a user function corresponding thereto.

Meanwhile, when a user applies pressure to specific keys corresponding to switches SW connected to a first resistor $R_1$ and a second resistor $R_2$ of the first sub-key row 210 to electrically connect the first resistor $R_1$ and the second resistor $R_2$ to the reference resistor $R_P$, a reference voltage VDD from the reference voltage unit 127 is divided by the reference resistor $R_P$, and the first resistor $R_1$ and the second resistor $R_2$ to generate the analog key input signal KEY_ADC. The generated analog key input signal KEY_ADC is transferred to the first comparator 121, the second comparator 123, and the first input signal port ADC1.

When the reference voltage VDD is divided by the reference resistor $R_P$, the first resistor $R_1$, and the second resistor $R_2$, the analog key input signal KEY_ADC generated corresponding thereto can be set to be less than the first comparator voltage V+. Accordingly, the first comparator 121 generates a "High" signal and transfers it to the first comparator port INT1.

When the reference voltage VDD is divided by the reference resistor $R_P$, the first resistor $R_1$, and the second resistor $R_2$, the analog key input signal KEY_ADC generated corresponding thereto can be set to be less than the second comparator voltage V− due to a parallel resistor connection. Accordingly, the second comparator 123 generates a "High" signal and transfers it to the second comparator port INT2.

Accordingly, when the "High" signal is transferred to the first comparator port INT1 and the second comparator port INT2, the controller 160 checks that the analog key input signal KEY_ADC transferred to a first input signal port ADC1 is invalid. Accordingly, the controller 160 may control disregard of the analog key input signal KEY_ADC.

The foregoing embodiment has been described that the second comparator 123 outputs a "Low" signal being a second signal when the analog key input signal KEY_ADC generated in a state that one switch SW is activated is received, and the second comparator 123 outputs a "High" signal being a first signal when the analog key input signal KEY_ADC generated in a state that more than two switches SW are activated is received. However, the present invention is not limited thereto. That is, characteristics in the first signal and the second signal in the second comparator 123 can be changed to each other according to a manufacturing scheme of the portable terminal 100. The foregoing embodiment is an explanation of a configuration and an operation of an input unit of the portable terminal according to an embodiment of the present invention.

Hereinafter, an operation method of an input unit of the portable terminal according to an exemplary embodiment of the present invention will be described.

Figure 4:
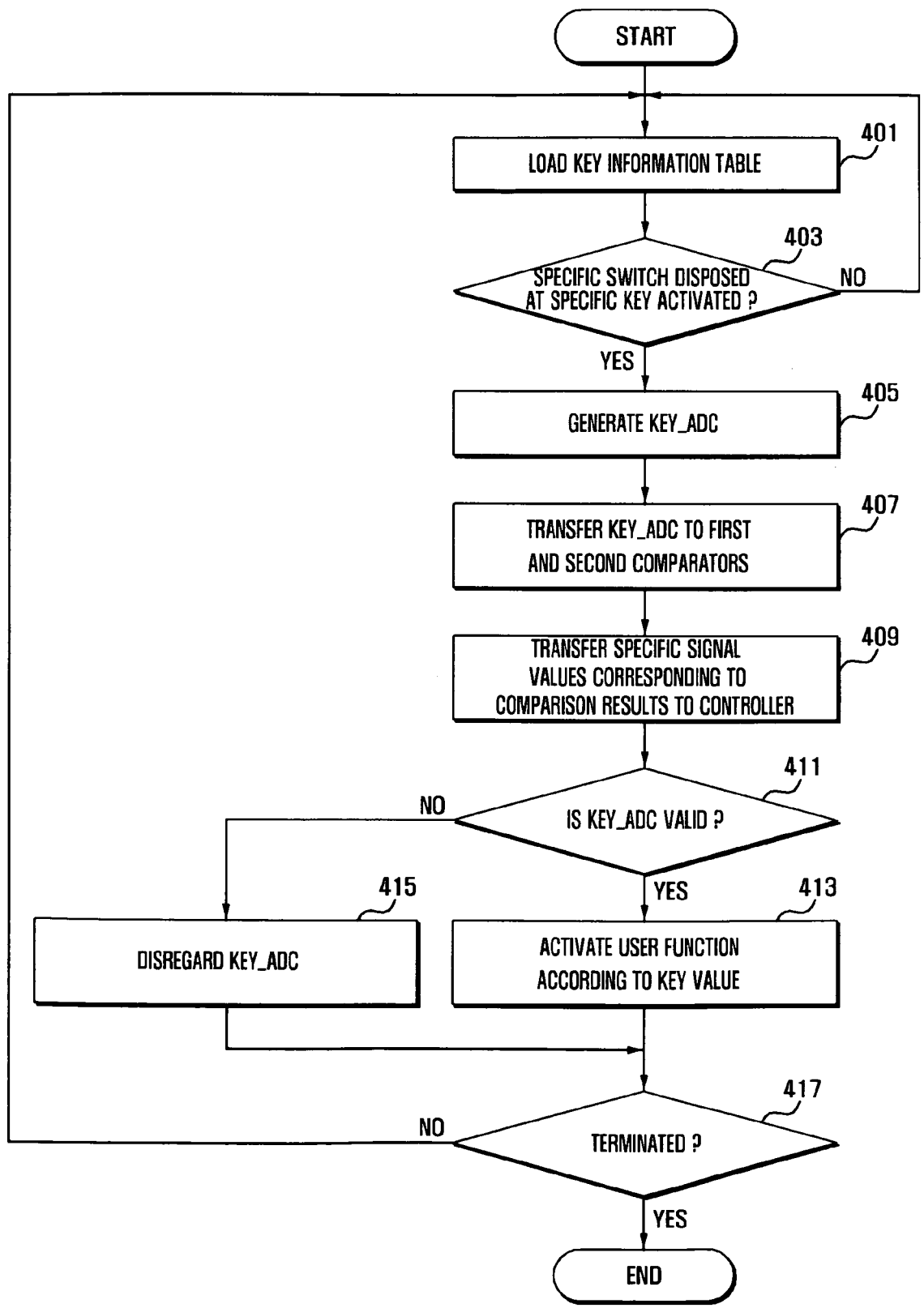
FIG. 4 illustrates an operation method of an input unit of the portable terminal according to an exemplary embodiment of the present invention.

FIG. 4 illustrates an operation method of an input unit of the portable terminal according to an exemplary embodiment of the present invention.

Referring to FIG. 1 through FIG. 4, in an operation method of an input unit of the portable terminal according to an exemplary embodiment of the present invention, when power is supplied, a controller 160 of the portable terminal 100 initializes respective structural elements of the portable terminal 100 using the supplied power and control loading of a key information table stored in the storage unit 150 (401). Accordingly, the controller 160 may perform a setting procedure for operation of the input unit 120.

When a user applies pressure to an input unit 120, the controller 160 of the portable terminal 100 checks whether a specific switch SW of the key row 125 disposed at a specific key to which the pressure is applied is activated (403). When the specific switch SW is activated, the input unit 120 of the portable terminal 100 divides the reference voltage VDD provided from the reference voltage unit 127 using a specific resistor connected to the activated switch SW and a reference resistor RP to generate an analog key input signal KEY_ADC (405). Next, the input unit 120 transfers the analog key input signal KEY_ADC to the first comparator 121 and the second comparator 123 (407). When the specific switch SW is not activated, the controller 160 returns to step 401 and performs step 403 while maintaining a loaded state of a key information table.

The first comparator 121 compares the analog key input signal KEY_ADC with a first comparator voltage V+, and the second comparator 123 compares the analog key input signal KEY_ADC with a second comparator voltage V−. Next, the first comparator 121 and the second comparator 123 may transfer specific signal values corresponding to the comparison results to the controller 160 (409).

More particularly, the first comparator 121 provided at the input unit 120 uses a first comparator voltage V+ being greater than a value obtained by dividing the reference voltage VDD by a resistance value of the reference resistor $R_P$ and the greatest resistance value included in the key row 125, for example, a resistance value of the first resistor $R_1$. Further, the second comparator 123 uses a second comparator voltage V− greater than a value obtained by dividing the reference voltage VDD by a resistance value of the reference resistor $R_P$ and a half of the greatest resistance value included in the key row 125, for example, a resistance of the first resistor $R_1$. When the analog key input signal KEY_ADC corresponding to a voltage divided signal achieved by the specific resistor and the reference resistor $R_P$ is less than the first comparator voltage V+, the first comparator 121 may transfer a "High" signal to a first comparator port INT1 of the controller 160. When the analog key input signal KEY_ADC is less than the second comparator voltage V−, the second comparator 121 may transfer a "Low" signal to a second comparator port INT2 of the controller 160.

The controller 160 checks whether a currently generated analog key input signal KEY_ADC value is valid according to specific signal values provided from the first comparator 121 and the second comparator 123 (411). For example, when the controller 160 receives a "High" signal from the first comparator 121 and a "Low" signal from the second comparator 123, it checks that the analog key input signal KEY_ADC is valid. When the analog key input signal KEY_ADC is valid, the controller 160 can check a key information table to check a key value of the currently received analog key input signal KEY_ADC, and control activation of a user function corresponding thereto (413).

When the analog key input signal KEY_ADC is invalid, the controller 160 can control disregard of the currently received analog key input signal KEY_ADC (415). For example, when the controller 160 receives a "High" signal from the first comparator 121 and the second comparator 123, it can check that the currently received analog key input signal KEY_ADC is invalid.

Next, the controller 160 checks whether the portable terminal is terminated (417). When a separate input for termination does not occur, the controller 160 returns to step 401 and control repetitive execution of following procedures.

As described above, an operation method of an input unit of the portable terminal according to an embodiment of the present invention checks whether a currently input signal is valid or invalid according to an output signal of a comparator transferred to an input unit 120, and checks a key value corresponding to the input signal when the currently input signal is valid to control activation of a user function corresponding thereto.

The foregoing portable terminal 100 may include a near distance communication module for near distance communication, a camera module photographing still/moving images of a subject, an interface unit for performing data transmission and reception by a wired communication scheme and a wireless communication scheme of the portable terminal, an Internet communication module communicating with an Internet to perform an Internet function, and a digital broadcast module performing digital broadcast receiving and playing functions besides the foregoing structural elements according to a provided form. Since the structural elements can be variously modified according to a convergence trend of a digital device, all elements cannot be described. Structural elements equivalent to the foregoing structural elements can be included in the portable terminal 100. In the portable terminal 100 of the present invention, specific elements can be excluded from the foregoing structural elements according to a providing form or substituted by other elements. This will be easily appreciated by a person having ordinary skill in the art.

Furthermore, the portable terminal 100 according to an embodiment of the present invention may include a device of all forms by using a key pad as an input unit 120. For example, the portable terminal may include all kinds of information and communication devices and multi-media devices such as Portable Multimedia Player (PMP), digital broadcast player, Personal Digital Assistant (PDA), music player (e.g., MP3 player), portable game terminal, wired and wireless telephone, Smart Phone, and applications thereof as well as all mobile communication terminals operating based on communication protocols corresponding to various communication systems.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An input unit of a portable terminal, comprising:
  a reference resistor including a first and second end, wherein the first end is connected to a sampling point;
  a plurality of switches separately connected to the sampling point;
  a plurality of resistors of different values connected to each of the plurality of switches, respectively;
  a reference voltage unit connected to the second end of the reference resistor and configured to provide a reference voltage;
  a first comparator and a second comparator each connected to the sampling point and configured to output a first signal if the reference voltage at the sampling point exceeds a threshold and a second signal if the reference voltage at the sampling point is below a threshold; and a controller, connected to the sampling point and outputs of the first and second comparators, configured to output a unique signal corresponding to an activated switch.

2. The input unit of claim 1, wherein a smallest resistance value is greater than a half of a greatest resistance value among the different resistance values.

3. The input unit of claim 2, wherein the first comparator includes a first comparator voltage greater than a voltage achieved by dividing the reference voltage by a resistor including the greatest resistance value and the reference resistor, and less than the reference voltage as a referring voltage.

4. The input unit of claim 3, wherein the first comparator is configured to output a first signal when at least one of the switches is activated, and output a second signal when the switches are inactivated.

5. The input unit of claim 2, wherein the second comparator includes a second comparator voltage as a referring voltage by dividing the reference voltage by a half of the greatest resistance value and the reference resistor.

6. The input unit of claim 5, wherein the second comparator is configured to output a first signal set to check that an analog key input signal is invalid when at least two of the switches are activated, and the second comparator is configured to output a second signal set to check that the analog key input signal is valid when at least one of: the switches are inactivated; and one of the switches is activated.

7. A portable terminal comprising:
    an input unit including a reference resistor including a first and second end, wherein the first end is connected to a sampling point; a plurality of switches separately connected to the sampling point; a plurality of resistors of different values connected to each of the switches, respectively; a reference voltage unit connected to the second end of the reference resistor and configured to provide a reference voltage; and a first comparator and a second comparator each connected to the sampling point and configured to output a first signal if the reference voltage at the sampling point exceeds a threshold and a second signal if the reference voltage at the sampling point is below a threshold;
    a controller, connected to the sampling point and outputs of the first comparator and the second comparator, configured to output a unique signal corresponding to an activated switch; and
    a storage unit including a key information table for searching a key value corresponding to the unique signal.

8. The portable terminal of claim 7, wherein the input unit includes a key row composed of the plurality of resistors.

9. The portable terminal of claim 8, wherein a smallest resistance value is greater than a half of a greatest resistance value among the different resistance values.

10. The portable terminal of claim 9, wherein the first comparator includes a first comparator voltage as a referring voltage than a voltage dividing the reference voltage achieved by a resistor having the greatest resistance value and the reference resistor, and less than the reference voltage; and
    the second comparator includes a second comparator voltage as a referring voltage by dividing the reference voltage by a half of the greatest resistance value and the reference resistor.

11. The portable terminal of claim 10, wherein the first comparator is further configured to output a first signal when at least one of the switches is activated, and the second comparator is further configured to output a first signal set to check that an analog key input signal is invalid when at least two of the switches are activated.

12. The portable terminal of claim 11, wherein the controller is further configured to check that the analog key input signal is invalid when a first signal is received by the first comparator port and the second comparator port.

13. The portable terminal of claim 10, wherein the first comparator is further configured to output a first signal when one of the switches is activated, and
    the second comparator is further configured to output a second signal set to check that an analog key input signal is valid when one of the switches are activated.

14. The portable terminal of claim 13, wherein the controller is further configured to check that the analog key input signal is valid when a first signal is received by the first comparator port and a second signal is received by the second comparator port.

15. An operation method of an input unit of a portable terminal, comprising:
    activating at least one of a plurality of switches in a key row including a reference resistor, the a reference resistor including a first and second end, the first end is connected to a sampling point, the switches separately connected to the sampling point, wherein a plurality of resistors of different values are connected to each of the switches, respectively;
    providing a reference voltage by a voltage unit connected to the second end of the reference resistor;
    comparing, using a first comparator and a second comparator each connected to the sampling point, the reference voltage at the sampling point to a threshold, outputting a first signal if the reference voltage at the sampling point exceeds a threshold, and outputting a second signal if the reference voltage at the sampling point is below a threshold; and
    outputting, using a controller connected to the sampling point and outputs of the first and second comparators, a unique signal corresponding to an activated switch.

16. The method of claim 15, further comprising: checking whether a generated analog key input signal is valid when the generated analog key input signal is less than a first comparator voltage and greater than a second comparator voltage.

17. The method of claim 16, wherein checking whether the generated analog key input signal is valid comprises checking that the generated analog key input signal is invalid when the generated analog key input signal is less than the second comparator voltage.

18. The method of claim 16, wherein comparing the reference voltage at the sampling point to a threshold comprises:
    setting a first comparator voltage less than the reference voltage and greater than a voltage obtained by dividing the reference voltage by the reference resistor and a resistor of the resistors arranged in the key row having a greatest resistance value; and
    setting a second comparator voltage to a voltage obtained by dividing the reference voltage by a resistance value of a reference resistor and a half of a resistor having the greatest resistance value.

19. The method of claim 15, wherein the input unit includes a key row composed of a plurality of resistors with different resistance values and a smallest resistance value is greater than a half of a greatest resistance value among the different values.

* * * * *